United States Patent [19]
Cullis et al.

[11] Patent Number: 4,535,220
[45] Date of Patent: Aug. 13, 1985

[54] INTEGRATED CIRCUITS

[75] Inventors: Anthony G. Cullis, Worcester; Hugh C. Webber; Nigel G. Chew, both of Malvern, all of England

[73] Assignee: The Secretary of State for Defence in Her Britannic Majesty's Government of the United Kingdom of Great Britain and Northern Ireland, London, England

[21] Appl. No.: 430,381

[22] Filed: Sep. 30, 1982

[30] Foreign Application Priority Data

Nov. 10, 1981 [GB] United Kingdom ............... 8133926

[51] Int. Cl.³ .............................................. B23K 26/00
[52] U.S. Cl. ............................. 219/121 LM; 148/1.5; 357/50
[58] Field of Search ..... 219/121 L, 121 LM, 121 LE, 219/121 LF; 148/1.5, 187; 357/50, 91, 2, 30

[56] References Cited

U.S. PATENT DOCUMENTS

| | | |
|---|---|---|
| 3,615,317 | 10/1971 | Jagodzmski ........................ 264/25 |
| 4,058,699 | 11/1977 | Von Vloten ........................ 264/25 |
| 4,240,843 | 12/1980 | Celler et al. ............... 219/121 LF X |
| 4,322,253 | 3/1982 | Pankove et al. ........... 219/121 L X |
| 4,338,616 | 7/1982 | Bol .................................... 357/22 X |
| 4,370,175 | 1/1983 | Levatter ........................... 357/30 X |

FOREIGN PATENT DOCUMENTS 1410896 10/1975 United Kingdom .
1520595 8/1978 United Kingdom .
2044980 10/1980 United Kingdom .

Primary Examiner—C. L. Albritton
Attorney, Agent, or Firm—Cushman, Darby & Cushman

[57] ABSTRACT

An integrated circuit comprises a substrate having a plurality of components electrically isolated by regions of amorphous material formed by laser irradiation. Typically the laser radiation has a wavelength less than 400 nm a pulse length between 0.1 and 10 μsec, and a power density between 0.1 and 0.8 J/cm². The substrate material may be Si, Ge, GaAs, GaAlAs, InAs, InP, InAlP.

3 Claims, 6 Drawing Figures

INTEGRATED CIRCUITS

The invention relates to integrated circuits in which a plurality of circuit elements are formed on the surface of a substrate.

The most common substrate material is silicon and various circuit components are fabricated on its surface. For example transistors, capicitors, resistors, conducting channels are formed using suitable dopants, etc., selectively diffused into the substrate surface. Ion implantation and annealing is also used.

One problem is electrical isolation between elements in areas where isolation is required. For example close spaced conducting channels may be isolated by an ion implanted strip or channel.

In the present invention electrical isolation between circuit elements formed on a single crystal substrate is provided by regions of amorphous substrate formed by laser irradiation. The substrate may be silicon.

Amorphous silicon has a high electrical resistivity and therefore gives good electrical isolation. It is however difficult to form amorphous silicon on crystalline silicon.

Previous workers have reportedly obtained amorphous silicon using laser radiation of crystalline silicon. One article by R. Tsu et al in Phys. Rev. Lett. 42(20) 14 May 1979 pp 1356/8 describes use of a frequency quadrupled 10 ns pulsed Nd:YAG laser. The article shows an apparently amorphous ring with thickness variations. Some specimens had isolated amorphous regions within single crystal areas.

Another article, by P. L. Liu et al Appl. Phys. Letts. 34(12) 15 June 1979 pp 864/6, described use of a 30 psec. pulse of 266 nm. Again a ring of amorphous silicon was produced around single crystal material.

In both these articles the amorphous material shows variation of depth and uniformity. From the prior art it does not seem possible to produce amorphous material in a reproducable manner with the depth and uniformity necessary for semiconductor device manufacture.

According to another aspect of this invention an integrated circuit comprises a semiconductor substrate, a plurality of electrical components electrically separated from one another, characterised by regions of amorphous substrate material providing electrical isolation between components.

The substrate may be silicon, germanium, gallium arsenide, gallium aluminum arsenide, indium phosphide, indium aluminium phosphide or any other suitable III-V compound or other suitable semiconductor. The substrate may be bulk crystalline material or a high quality epitaxial layer grown on a supporting base.

The substrate may have large areas or its total surface formed into an amorphous layer subsequently annealed to its crystalline form in selected areas. To provide large area irradiation a laser diffusing pipe may be used. Such a pipe is described in U.K. Pat. Specification No. 2,037,000 A (U.S.A. Pat. No. 4,305,640). It comprises a rod bent about 90° between its end and a ground surface on its input end. This gives a uniform power density across the whole irradiated spot.

Annealing of amorphous areas may be by laser irradiation or electron or ion beam heating.

The nature of laser radiation necessary to form amorphous areas various with the substrate. For silcon radiation absorption in about 3,000 Å is required. This means a laser wavelength in the blue to ultra violet region and a pulse length of around 0.5 to 5 manosec. Power density may be around 0.2 to 0.3 J/cm$^2$ for (001) surfaces and 0.3 to 0.6 J/cm$^2$ for (111) surfaces. Depth of the amorphous region may be increased by cooling the substrate, e.g. to 77° K. with liquid nitrogen. Power density for these cooled substrates should be increased by 1.5 to 2 times.

The invention will now be described, by way of example only, with reference to the accompanying drawings of which:

Figure 1:
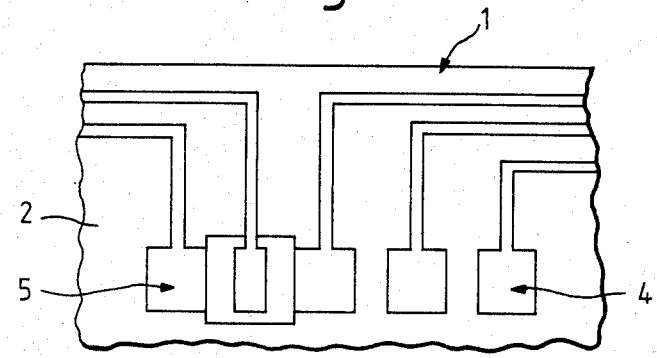
FIG. 1 is a plan view of part of an integrated circuit.
Figure 2:
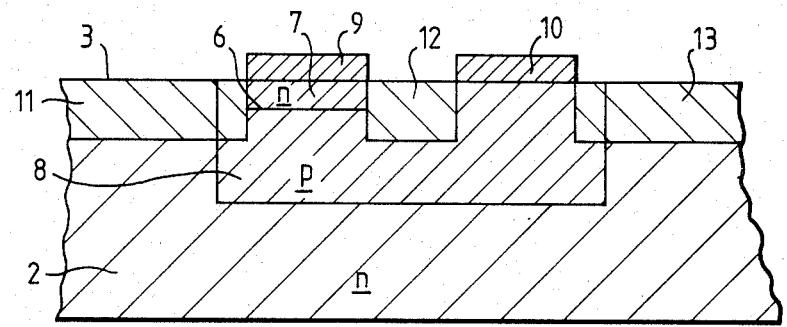
FIG. 2 is a sectional view of part of FIG. 1 to an enlarged scale.

As shown in FIGS. 1, 2 an integrated circuit 1 comprises a silicon substrate 2 having a flat upper surface 3 in which a plurality of elements are formed. Only two elements, and interconnecting lines, are shown in FIG. 1, a diode 4 and a field effect transistor 5. The diode 4, FIG. 2, comprises a p-n junction 6 formed between at n-type region 7 and a p-type region 8, in an n-type substrate 2. Metal pads 9,10 connect these two regions. Electrical isolation is provided by areas of amorphous silicon 11, 12, 13 which have a higher resistivity e.g. > 10$^6$ ohm cm.

The diode 4 is produced as follows: other circuit elements are also produced at the same time but are not described further.

Figure 3:
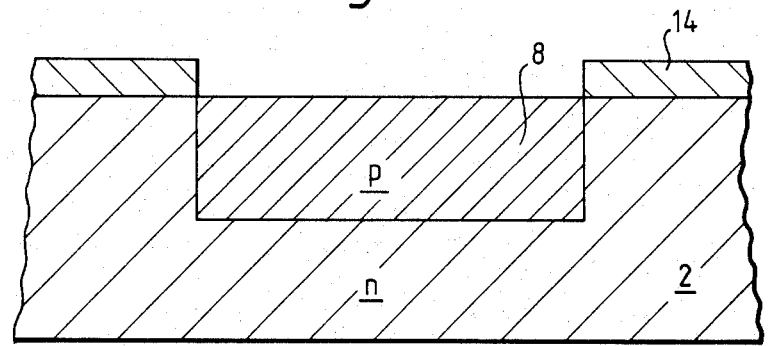
FIGS. 3 to 6 are sectional views of FIG. 2 showing process steps.

A silicon slice of n-type material, FIG. 3, has a region of p-type dopant diffused e.g. by ion implantation through an aperture in a photo lithographic mask 14 and annealing. The dopant may be boron, aluminium, gallium, indium, etc., diffused to a depth of about 3,000 Å. Typically the substrate has a resistivity of about 1–10 ohm/cm and the p-type region a resisitvity of about 10$^{-3}$ ohm/cm.

Figure 4:
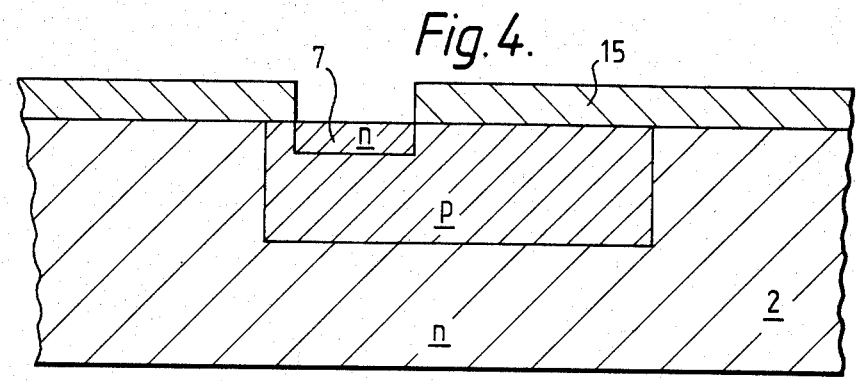

The mask 14 is removed and replaced by a mask 15, FIG. 4. An n-type region is formed by ion implanting arsenic, phosphorous, antimony or bismuth, etc. to a typical depth of 500 Å. The mask 15 is removed.

A beam 18 of a laser's 19 radiation is indexed along the complete surface 3 by a mirror 20 to form a layer 16 of amorphous silicon.

Typically the layer is 1,000 Å thick, the laser wavelength 347 nanometers, pulse length 2.5 nanoseconds. Power density varies with surface orientation, for a (001) surface the power is about 0.3 J/cm$^2$ for a (111) surface is about 0.3 to 0.6 J/cm$^2$ if the irradiation is at room temperature. It is necessary to raise the temperature of the desired layer 16 thickness quickly and allow a very quick cooling. Above a critical cooling rate melt will solidify to an amorphous state; below this rate the melt will recrystallise. The depth of melting governed by the optical absorption of silicon so that short wavelengths are required to produce amorphous layers of around 1,000 Å, longer wavelengths penetrate deep into the bulk. Additionally the period of heating governs layer 16 thickness. However a long heating period also heats the buld of the silicon. This is undesirable because the cooling rate would then decrease because of heat flow from the bulk into the layer 16. It is therefore necessary to select an appropriate wavelength and irradiate until the desired layer thickness is molten without heat flow into the crystal bulk.

Figure 5:
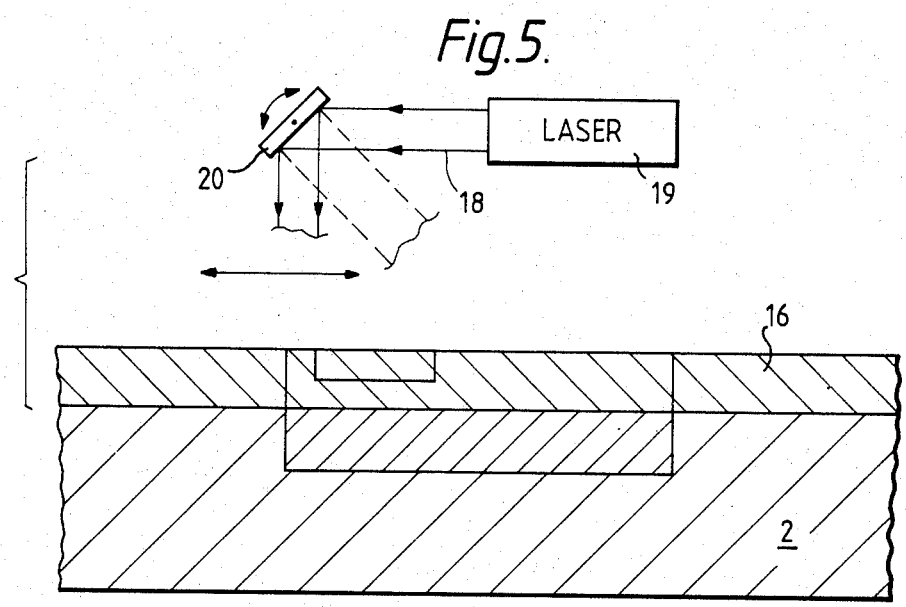
Figure 6:
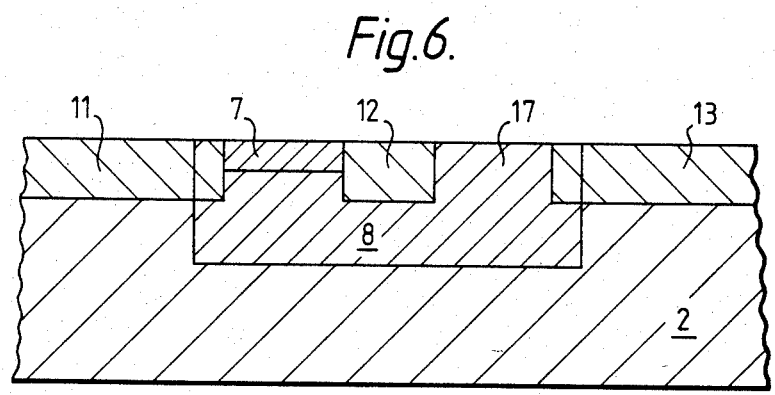

Having obtained the uniform amorphous layer 16 FIG. 5 it is then necessary to recrystllise the n region 7 and the p region below it, FIG. 6. Also a region 17 to the right of the p-n junction 6 needs recrystallising for a contact 10. From the above it follows that recrystallisation is obtained by selective heating of the layer 16 by a laser beam which gives a slower cooling rate. This may be obtained by increasing the laser power density or, pulse length or wavelength so that a localised heating of the bulk substrate occurs. Heat flow from the bulk reduces the rate of surface cooling. The annealing laser may be focussed on the required regions 7, 17 direct or through masks (not shown) on the surface 3. Alternatively the regions 7, 17 may be annealed with an electron or ion beam.

After recrystallising the regions 7, 17 metal pads 9, 10 are evaporated in place through masks.

In an alternative embodiment the amorphous regions 11, 12, 13 are formed separately by sweeping the laser radiation and/or irradiating through masks.

Resistive channels may be arranged using the laser 19 to form resistive paths of amorphous silicon. The widths of these paths may be trimmed by laser beam annealing. Alternatively resistive paths may be formed in doped crystalline silicon and the path width reduced by amorphising parts of the path sides. Likewise other elements in the circuit may have their values trimmed by selective amorphisation using the laser beam.

Another laser may be a synchronous mode argon ion pumped dye (e.g. stibene) laser typically mode locked at 50 MHz on a $3 \times 3$ μm pocket. Another type of laser is an Excimer laser at 300–400 nm.

We claim:

1. A method of providing electrical separation between electrical components on a single crystalline silicon substrate, the method comprising the steps of forming amorphous regions in the crystalline silicon substrate by selectively irradiating the silicon substrate with laser radiation of a wavelength less than 400 nanometers and a pulse length less than 10 nanoseconds so that most of the radiation is absorbed in the top 3,000 Å of the irradiated regions of the substrate which rapidly melts and rapidly freezes into an amorphous state, the amorphous regions forming electrically insulating regions adjacent single crystalline silicon regions of substrate.

2. The method of claim 1 wherein the pulse length is between 0.1 and 10 nanoseconds.

3. The method of claim 1 wherein the energy density of radiation is in the range 0.1 to 0.8 J/cm$^2$.

* * * * *